United States Patent
Hoshino

(10) Patent No.: US 7,306,509 B2
(45) Date of Patent: Dec. 11, 2007

(54) PROCESSING DEVICE, PROCESSING METHOD AND METHOD OF MANUFACTURING SEMICONDUCTOR DEVICE

(75) Inventor: Susumu Hoshino, Kawasaki (JP)

(73) Assignee: Nikon Corporation, Tokyo (JP)

( * ) Notice: Subject to any disclaimer, the term of this patent is extended or adjusted under 35 U.S.C. 154(b) by 192 days.

(21) Appl. No.: 10/792,396

(22) Filed: Mar. 4, 2004

(65) Prior Publication Data
US 2005/0014456 A1     Jan. 20, 2005

Related U.S. Application Data

(63) Continuation-in-part of application No. PCT/JP02/09391, filed on Sep. 13, 2002.

(30) Foreign Application Priority Data
Sep. 19, 2001   (JP) .............................. 2001-285318

(51) Int. Cl.
*B24B 1/00*  (2006.01)
(52) U.S. Cl. ..................... 451/41; 451/285; 451/28
(58) Field of Classification Search ........ 451/285–289, 451/41, 28, 56, 65
See application file for complete search history.

(56) References Cited

U.S. PATENT DOCUMENTS

| | | | |
|---|---|---|---|
| 6,062,954 A | 5/2000 | Izumi | |
| 6,121,143 A * | 9/2000 | Messner et al. | 438/692 |
| 6,183,345 B1 | 2/2001 | Kamono et al. | |
| 6,241,585 B1 * | 6/2001 | White | 451/41 |
| 6,379,230 B1 | 4/2002 | Hayashi et al. | |
| 6,575,818 B2 * | 6/2003 | Jeong | 451/285 |
| 2005/0014456 A1 * | 1/2005 | Hoshino | 451/41 |

FOREIGN PATENT DOCUMENTS

JP          2-257629         10/1990

(Continued)

*Primary Examiner*—Lee D. Wilson
(74) *Attorney, Agent, or Firm*—Morgan, Lewis & Bockius LLP

(57) ABSTRACT

A CMP apparatus 1 is constructed comprising a wafer chucking mechanism 20 which carries and holds a wafer W, a polishing pad 4 which performs polishing working on the surface of the wafer W that is being worked, and a polishing head 2 which holds the polishing pad 4. The polishing pad 4 held by the polishing head 2 performs polishing working on the surface that is being worked on the wafer W while being caused to move in contact with this surface that is being worked on the wafer W, which is carried and held by the wafer chucking mechanism 20. This polishing pad 4 has a rough polishing pad 4a that can partially work the surface that is being worked, and intermediate polishing and finishing polishing pads 4b and 4c that can uniformly work the entire surface of the surface that is being worked. The apparatus is constructed so that working that flattens undulations with indentations and projections in the film thickness of the surface that is being worked is performed by the rough polishing pad 4a, and the surface that is being worked is then uniformly worked by the intermediate polishing and finishing polishing pads 4b and 4c. As a result, even in cases where there are undulations with indentations and projections in the initial film thickness of the surface that is being worked, the surface that is being worked can be worked into a flat surface with a desired uniform residual film thickness.

20 Claims, 8 Drawing Sheets

FOREIGN PATENT DOCUMENTS

| | | |
|---|---|---|
| JP | 10-554 | 1/1998 |
| JP | 10-303152 | 11/1998 |
| JP | 11-20468 | 7/1999 |
| JP | 11-265860 | 9/1999 |

* cited by examiner (A)

(B)

PROCESSING DEVICE, PROCESSING METHOD AND METHOD OF MANUFACTURING SEMICONDUCTOR DEVICE

This is a continuation-in-part- form PCT International Application No. PCT/JP02/09391 filed on Sep. 13, 2002, which is hereby incorporated by reference

TECHNICAL FIELD

The present invention relates to a working apparatus and working method which are constructed to perform working on a worked surface by means of a working tool, and a semiconductor device manufacturing method using this working apparatus.

BACKGROUND ART

Apparatuses that perform various types of working such as polishing, grinding and lapping have been known in the past as working apparatuses which are constructed to perform working on a worked surface by means of a working tool. One example of such an apparatus is a chemical mechanical polishing apparatus (CMP apparatus) in which the workpiece is a semiconductor wafer, and the working tool comprises a polishing pad that performs surface polishing on this semiconductor wafer. Such CMP apparatuses have conventionally been used in semiconductor device manufacturing processes. CMP apparatuses are used in polishing treatments that polish and flatten films that are formed on the surfaces of wafers in semiconductor wafer manufacturing processes (e.g., the polishing of inter-layer insulating films, the polishing of surface metal films, the polishing of dielectric films, etc.). In such cases, a polishing treatment is required which leaves a uniform and flat film layer of a specified thickness on the surface of the wafer following the polishing treatment. Furthermore, for example, CMP apparatuses include the apparatuses disclosed in Japanese Patent Application Kokai No. H10-303152 and Japanese Patent Application Kokai No. H11-204468.

CMP apparatuses that have generally been used in the past are constructed using a polishing pad having an external diameter that is greater than the external diameter of the semiconductor wafer that is the object of polishing, so that the entire surface that is to be polished on the semiconductor wafer is pressed against the polishing surface of the polishing pad, thus uniformly polishing the entire surface that is to be polished. In this case, uniform polishing can be performed on the entire surface that is to be polished; however, if polishing that is uniform overall is performed in cases where there is an undulating shape with indentations and projections in the film thickness distribution of this surface that is to be polished prior to polishing, this undulation with indentations and projections will still remain in the film thickness distribution of the polished surface following polishing, so that it is difficult to flatten the polished surface, especially in the case of polishing of metal films, STI polishing, etc.

DISCLOSURE OF THE INVENTION

The present invention was devised in order to solve such problems. One object of the present invention is to provide a working apparatus and method which can work the surface that is being worked to a flat surface with a desired uniform amount of working (residual film thickness distribution, etc.) even in cases where there is an undulation with indentations and projections in the shape (film thickness distribution, etc.) of the surface that is being worked. Another object of the present invention is to provide a semiconductor device manufacturing method which uses such a working apparatus and working method.

Inventions that are used in order to achieve these objects will be described below. However, these individual inventions do not achieve all of the above-mentioned objects. It will be self-evident which objects are achieved by which inventions.

The first invention that is used in order to achieve the objects is a working apparatus which comprises a carrying and holding mechanism that carries and holds the workpiece, a working tool that performs working on the surface that is to be worked on the workpiece, and a tool holding mechanism that holds the tool, and which is constructed so that working is performed on the surface that is to be worked by causing relative motion between the working tool and the workpiece while causing the working tool to contact the surface that is to be worked on the workpiece, this working apparatus being characterized by the fact that the working tool has a first working tool that can partially work the surface that is to be worked, and a second working tool that can uniformly work the entire surface of the surface that is to be worked.

If a working apparatus with such a construction is used, the following operation can be performed: specifically if working that flattens undulations with indentations and projections in the film thickness of the surface that is being worked is first performed by means of the first working tool, then, even if undulations with indentations and projections in the film thickness are present on the surface that is being worked, flattening working can be performed by removing these undulations with indentations and projections by means of the first working tool. Then, working to a desired amount of working can subsequently be accomplished by uniformly working the surface that is being worked by means of the second working tool. As a result, working that produces a flat worked surface with a uniform amount of working can be accomplished.

The second invention that is used in order to achieve the objects is the first invention, which is characterized by the fact that the working surface of the first working tool is smaller than the working surface of the second working tool.

By making the working surface of the first working tool smaller than the working surface of the second working tool, it is possible to achieve efficient flattening of fine undulations with indentations and projections on worked surfaces that have such undulations with indentations and projections. Then, the entire surface of the surface that is being worked can be subsequently flattened to a uniform amount of working using the second working tool, which has a large working surface.

The third invention that is used in order to achieve the objects is the first invention or second invention, which is characterized by the fact that the working surface of the first working tool is smaller than the surface that is being worked.

If the working surface of the first working tool is made smaller than the surface that is being worked, it is possible to achieve efficient flattening of undulations with indentations and projections even in cases where the conditions of such undulations with indentations and projections vary according to the location on the surface that is being worked, by performing working with the first working tool in accordance with the location that is involved.

The fourth invention that is used in order to achieve the objects is any of the first through third inventions, which is characterized by the fact that the working surface of the second working tool is larger than the surface that is being worked.

By making the working surface of the second working tool larger than the surface that is being worked, it is possible to work all of the surface that is being worked at one time with the second working tool, so that the amount of working can easily be made uniform.

The fifth invention that is used in order to achieve the objects is any of the first through fourth inventions, which is characterized by the fact that the apparatus comprises a surface shape measuring device that measures undulations with indentations and projections on the surface that is being worked.

In this invention, the surface shape of the surface that is being worked can be measured by the surface shape measuring device prior to working by means of the working tool, and working that flattens undulations with indentations and projections in the film thickness of the surface that is being worked can be performed by means of the first working tool on the basis of these measurement results. Accordingly, undulations with indentations and projections in the surface that is being worked can be accurately flattened.

The sixth invention that is used in order to solve the problems is a working method which is characterized by the fact that this method uses the working apparatus of the fifth invention, the surface shape of the surface that is being worked is measured by the surface shape measuring device prior to working by means of the working tool, and working that flattens undulations with indentations and projections in the surface that is being worked is performed by means of the first working tool on the basis of these measurement results.

In this invention, as was described above, undulations with indentations and projections in the surface that is being worked can be accurately flattened.

The seventh invention that is used in order to solve the problems is a working method in which working is performed on a surface that is being worked on a workpiece by causing relative motion between the workpiece and a working tool while causing the working tool to contact the surface that is being worked in a state in which the workpiece is carried and held, this working method being characterized by the fact that the method has a process in which working that flattens undulations with indentations and projections in the surface that is being worked is performed by partially working the surface that is being worked, and the entire surface of the surface that is being worked is then uniformly worked.

In this invention, since working that flattens undulations with indentations and projections in the surface that is being worked is first performed by partially working the surface that is being worked, working that accomplishes flattening by removing such undulations with indentations and projections can be performed even in cases where such undulations with indentations and projections in the film thickness are present in the surface that is being worked. Furthermore, working to a desired working amount can be subsequently accomplished by uniformly working the entire surface of the surface that is being worked. As a result, working that produces a flat worked surface with a uniform amount of working can be accomplished.

The eighth invention that is used in order to achieve the objects is the seventh invention, which is characterized by the fact that the method has a process in which the surface shape of the surface that is being worked is measured, and working that flattens undulations with indentations and projections in this surface that is being worked is performed on the basis of these measurement results.

In this invention, since the surface shape of the surface that is being worked is measured prior to working that flattens undulations with indentations and projections in this surface that is being worked, and working that flattens the undulations with indentations and projections in this surface that is being worked is performed on the basis of these measurement results, undulations with indentations and projections in the surface that is being worked can be accurately flattened.

The ninth invention that is used in order to solve the problems is a semiconductor device manufacturing method which is characterized by the fact that a polishing pad that performs surface polishing on a workpiece is used as the working tool in the working apparatus of any of the first through fifth inventions or the working method of any of the sixth through eighth inventions, and this semiconductor device manufacturing method has a process in which surface polishing is performed on a semiconductor wafer constituting the workpiece.

As was described above, working that produces a flat worked surface with a uniform amount of working can be performed in the working apparatus of any of the first through fifth inventions or the working method of any of the sixth through eighth inventions. Accordingly, if polishing is performed using a polishing pad as the working tool in these apparatuses or methods when the polishing of a wafer is performed in a semiconductor manufacturing process, even if undulations with indentations and projections are present in a film on the surface of the wafer, these undulations with indentations and projections can be removed, so that the surface of the wafer can be polished with a uniform amount of polishing, and a flat worked surface (polished surface) can be obtained. Furthermore, polishing can also be performed so that a flat surface with a desired uniform residual film thickness can be obtained. Accordingly, lithographic processes can be accurately performed, and semiconductors with fine patterns can be manufactured with a good yield.

BEST MODE FOR CARRYING OUT THE INVENTION

Examples of preferred embodiments for working the present invention will be described below. However, it goes without saying that the scope of the present invention is not limited by the description of these embodiments.

Figure 1:
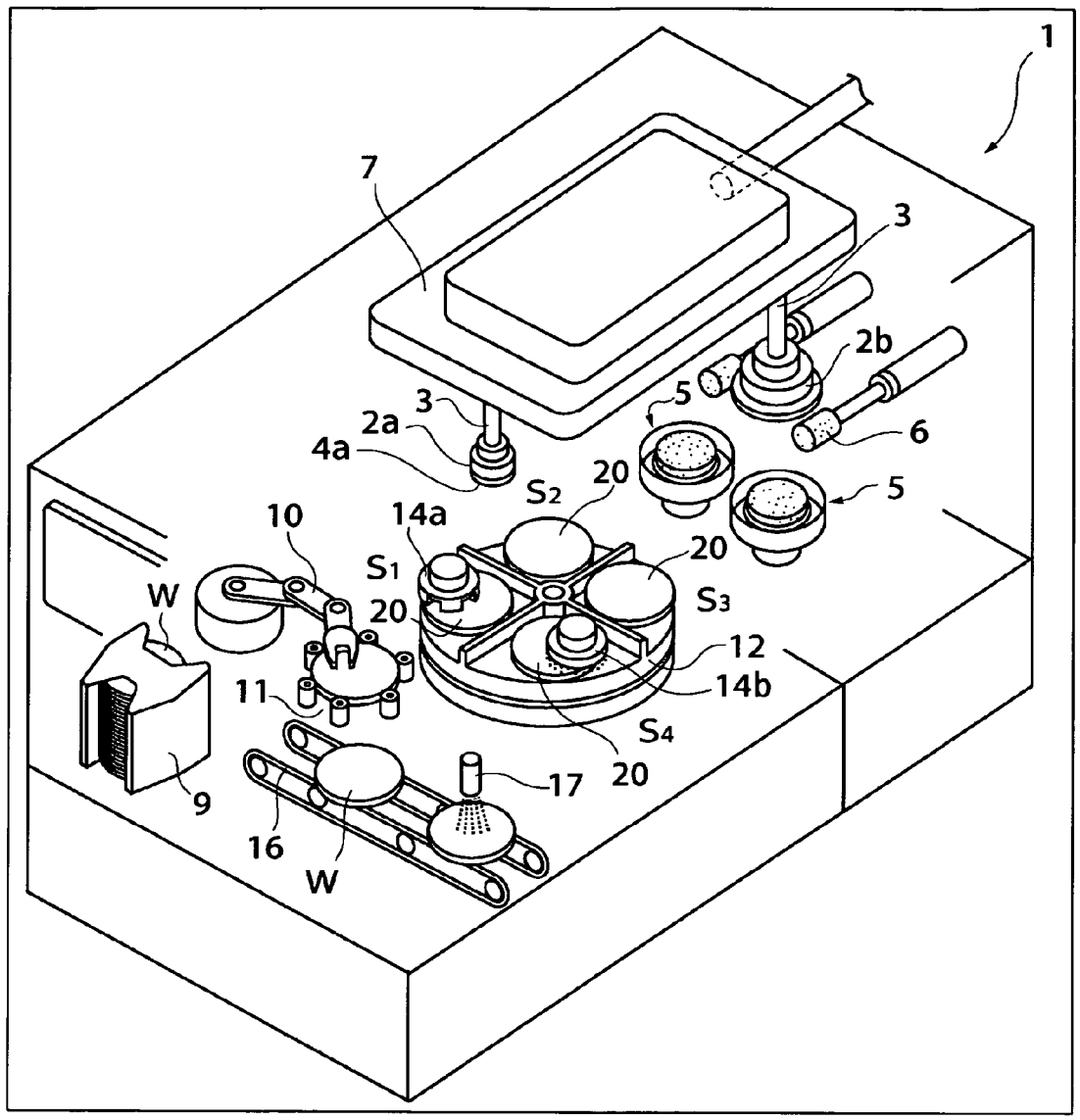
FIG. 1 is a perspective view which shows a CMP apparatus constituting an embodiment of the present invention.
Figure 2:
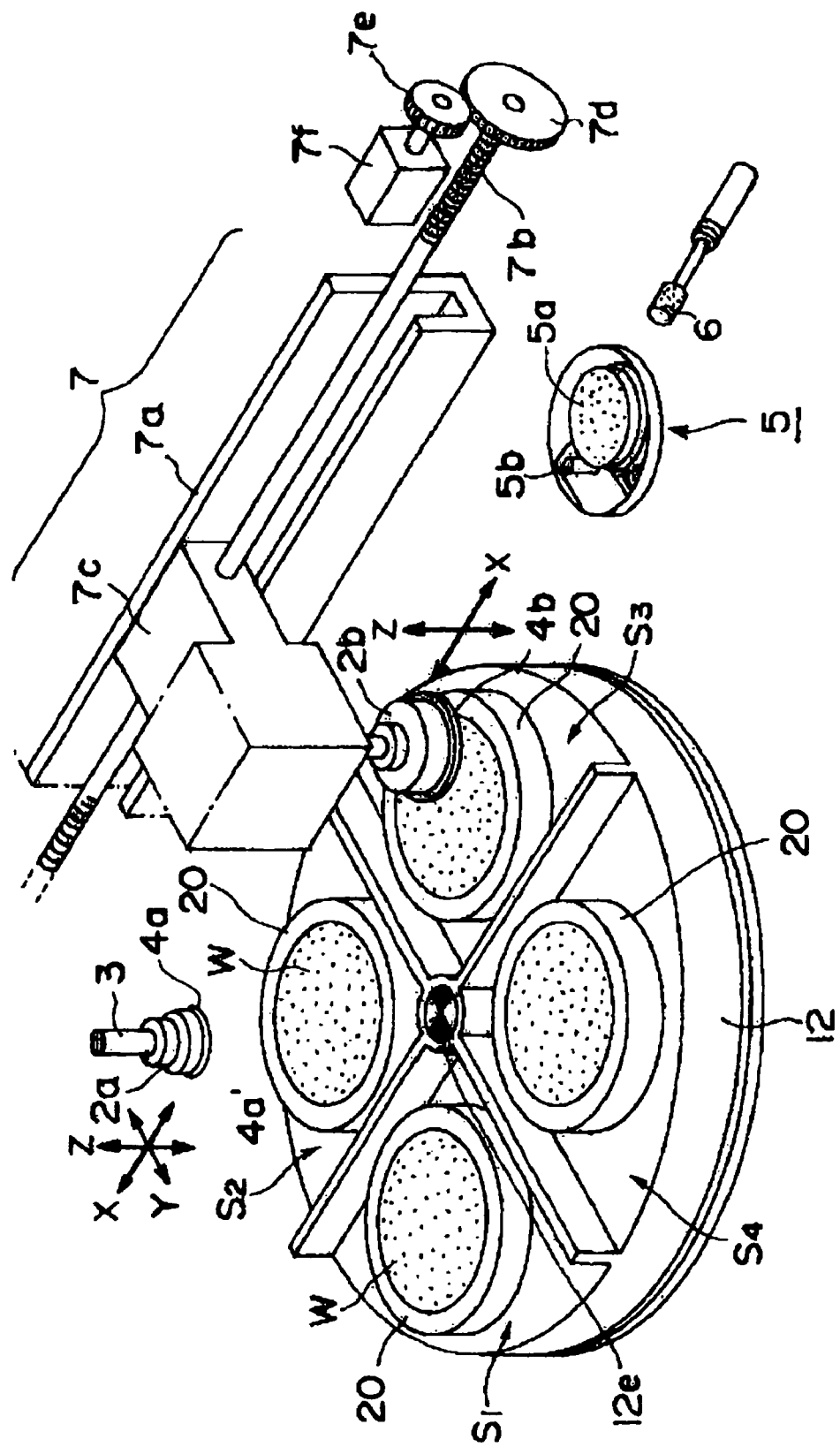
FIG. 2 is a perspective view which shows a portion of the CMP apparatus shown in FIG. 1.

A CMP (chemical mechanical polishing) apparatus which is a typical example of the working apparatus of the present invention will be described with reference to FIGS. 1 and 2. This CMP apparatus 1 has a plurality of polishing heads which are supported by a polishing head conveying mechanism 7 with the polishing surfaces facing downward. These polishing heads comprise a polishing head 2a used for rough polishing, a polishing head 2b used for intermediate polishing, and a polishing head 2c used for finishing polishing (the polishing head 2c used for finishing polishing is not shown in the figures). These polishing heads will be described collectively as the polishing head 2 using the symbol 2. The polishing head 2 is attached to a rotating shaft 3 that extends downward from the polishing head conveying mechanism 7, and the apparatus is constructed so that the polishing head 2 is rotationally driven by a motor (not shown in the figures) inside the polishing head conveying mechanism 7.

This polishing head 2 has a pad holding mechanism on its lower end, and a polishing pad 4 is held by the pad holding mechanism so that the polishing surface faces downward, and is detachably attached to the lower end of the polishing head 2. In this case, the polishing head 2a used for rough polishing is formed smaller than the polishing head 2b used for intermediate polishing and polishing head 2c used for finishing polishing, and a small-diameter polishing pad 4a used for rough polishing is attached to the polishing head 2a used for rough polishing. The polishing head 2b used for intermediate polishing and the polishing head 2c used for finishing polishing are formed larger than the polishing head 2a used for rough polishing, and a polishing pad 4b used for intermediate polishing and a polishing pad 4c used for finishing polishing that are larger in diameter than the polishing pad 4a used for rough polishing are respectively attached to these polishing heads 2b used for intermediate polishing and 2c used for finishing polishing.

The polishing pad 4a used for rough polishing is a polishing pad which performs polishing that corrects the undulations with indentations and projections in the film thickness on the surface, and that flattens the surface, by partially polishing the surface of the wafer W that is the object of polishing; this polishing pad 4a is constructed so that this pad has a diameter that is sufficiently smaller than the surface of the wafer W. On the other hand, the polishing pad 4b used for intermediate polishing and the polishing pad 4c used for finishing polishing are polishing pads that uniformly polish the surface of the wafer W in which the undulations with indentations and projections in the film thickness on the surface have been corrected and flattened by the polishing pad 4a used for rough polishing; these polishing pads have a size that covers a large part or all of the surface of the wafer W. Specifically, as is shown in FIG. 2, the polishing pad 4b used for intermediate polishing and the polishing pad 4c used for finishing polishing are constructed so that these pads have a diameter that is larger than the radius of the wafer W and thus cover a large portion of the surface of the wafer, or so that these pads have a diameter that is larger than the diameter of the wafer W and thus cover all of the surface of the wafer. Furthermore, these polishing pads 4a, 4b and 4c will be described collectively as the polishing pad 4 using the symbol 4.

A pad conditioning mechanism 5 is disposed inside the CMP apparatus 1; dressing of the polishing pad 4 is performed here. A dressing disk 5a, a spray nozzle 5b, and a rotatable cleaning brush 6 are disposed in the pad conditioning mechanism 5 as shown in the figures.

The polishing head conveying mechanism 7 has a rail 7a, a feed screw 7b, and a moving body 7c that is screw-engaged with the feed screw. The polishing head 2 is attached to the moving body 7c via the rotating shaft 3. The feed screw 7b is rotationally driven by a motor 7f via gears 7d and 7e, so that the moving body 7c is moved in the x direction shown in FIG. 2. Furthermore, the polishing head 2 is raised and lowered in the z direction shown in FIG. 2 by a raising-and-lowering mechanism (not shown in the figures) that is disposed inside the moving body 7c. Such a mechanism is provided for each of the respective polishing heads 2a, 2b and 2c, so that each of these polishing heads can be independently moved in the x and z directions; in particular, however, the apparatus is constructed so that the polishing head 2a used for rough polishing can also be moved in the y direction perpendicular to the x and z directions.

An accommodating cassette 9 that accommodates wafers W that are objects of polishing is further disposed in the CMP apparatus 1, and a wafer conveying robot 10 that conveys the wafers W is provided for this accommodating cassette 9. The wafer conveying robot 10 is a robot that is used to convey wafers W in an unpolished state from the accommodating cassette 9 to an index table 12, and to convey wafers W out following the completion of polishing. A wafer temporary carrying stand 11 on which the wafers W are temporarily placed is disposed at an intermediate point in this conveying path.

The index table 12 is constructed so that this table comprises four rotatable wafer chucking mechanisms 20 that are disposed at equal intervals on the circumference of the same circle centered on a shaft 12e. This index table 12 is divided into a wafer loading and unloading zone indicated by the symbol $S_1$, a rough polishing zone indicated by the symbol $S_2$, an intermediate polishing zone indicated by the symbol $S_3$, and a finishing polishing zone indicated by the symbol $S_4$. Accordingly, each wafer chucking mechanism 20 successively moves to the wafer loading and unloading zone $S_1$, rough polishing zone $S_2$, intermediate polishing zone $S_3$, and finishing polishing zone $S_4$ in accordance with the rotation of the index table 12. Furthermore, the polishing pad 4a used for rough polishing, which is held on the polishing head 2a used for rough polishing, the polishing pad 4b used for intermediate polishing, which is held on the polishing head 2b used for intermediate polishing, and the polishing pad 4c used for finishing polishing, which is held on the polishing head 2c used for finishing polishing, are respectively positioned above the rough polishing zone $S_2$, intermediate polishing zone $S_3$, and finishing polishing zone $S_4$.

The wafer conveying robot 10 is also used as an unloading conveying robot that conveys the wafers W on which polishing has been completed; the wafers W on which polishing has been completed are conveyed onto a belt conveyor 16 by this robot 10, and are fed into a wafer cleaning mechanism 17 by the belt conveyor 16, so that the wafers are cleaned. Furthermore, the apparatus also has a chuck dresser 14a and a chuck cleaning mechanism 14b that dress and clean the respective wafer chucking mechanisms 20 of the index table 12.

A first working method in which a polishing working method is performed on the surface of a wafer W (surface that is being worked) using the CMP apparatus 1 constructed as described above will be described in detail with reference to FIG. 3. Before polishing working is performed on the surface of a wafer W by means of this CMP apparatus, the surface shape of the wafer W is measured by means of a surface film thickness shape measuring device (not shown in the figures) (step S1). After the measurement result data has been stored in memory following this measurement, the wafer W is accommodated inside the accommodating cassette 9 inside the CMP apparatus 1. Then, surface polishing of the wafer W by the CMP apparatus 1 is initiated. The wafer W inside the accommodating cassette 9 is placed on the wafer temporary carrying stand 11 by the wafer conveying robot 10, and after the undersurface of the wafer is cleaned, the wafer W is conveyed by the conveying robot 10, and is placed and held on the wafer chucking mechanism 20 that is positioned in the loading and unloading zone $S_1$ of the index table 12 (step S2).

Next, the index table 12 rotates 90 degrees in the clockwise direction, so that the wafer W held on the wafer chucking mechanism 20 moves into the rough polishing zone $S_2$ (step S3). Then, the polishing head 2a used for rough polishing that is supported on the rotating shaft 3 is lowered (moved in the z direction), so that the polishing pad 4a used for rough polishing is pressed against the surface that is being polished on the wafer W, and the polishing head 2a used for rough polishing is rotationally driven, so that rough polishing of the surface that is being polished on the wafer W is performed. This rough polishing working performs polishing that corrects undulations with indentations and projections in the film thickness on the surface of the wafer W, and control that causes the rotating head 2a used for rough polishing to move in the x and y directions while contacting the surface of the wafer W that is held in a stationary position is performed on the basis of the shape measurement data that has been measured by the surface film thickness shape measuring device and stored in memory. As a result, the polishing pad 4a used for rough polishing, which has a small diameter, is caused to move in the x and y directions over the surface that is being polished on the wafer W, thus causing polishing working to be performed on the surface that is being polished so that the undulating shape with indentations and projections in the film thickness on the surface is corrected and flattened, i.e., so that projecting parts are polished to a greater extent, thus eliminating undulations with indentations and projections in the surface (step S4).

Figure 4:
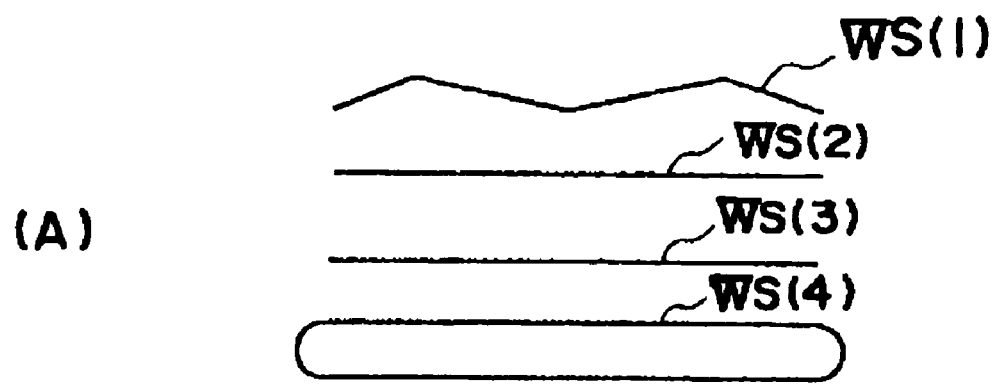
FIG. 4 is an explanatory diagram which shows in model form the surface shape in cases where polishing working is performed using the CMP apparatus shown in FIG. 1 and a conventional CMP apparatus.
Figure 4:
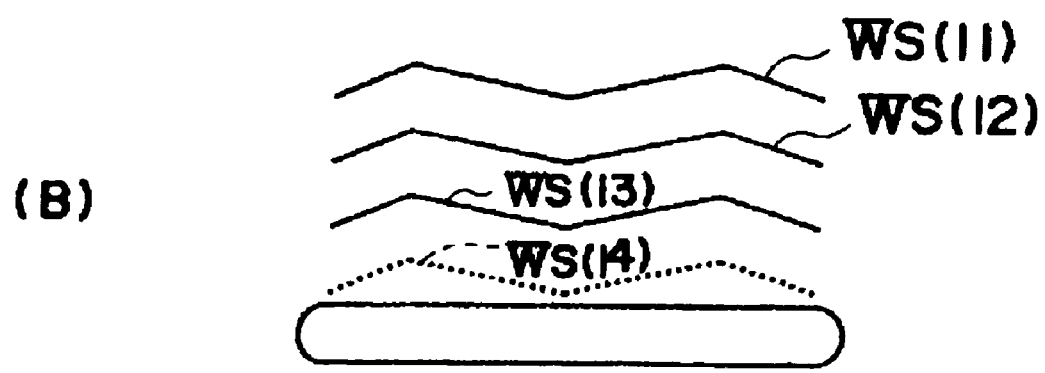

This rough polishing working is performed until the undulations with indentations and projections in the film thickness on the surface that is being polished on the wafer W are corrected, and a desired amount of polishing is obtained. Accordingly, in step S5, a judgement is made as to whether or not the rough polishing working has been completed, and this rough polishing working is ended at the point in time at which it is judged that the rough polishing working has been completed. In this judgement of completion, the time required for the desired amount of polishing to be obtained by means of the polishing pad 4a used for rough polishing is determined beforehand, and it is judged that the rough polishing working has been completed when this time has elapsed. Furthermore, it would also be possible to use a polishing end point detector that directly measures the amount of polishing of the surface that is being worked, and to judge that the rough polishing working has been completed at the point in time at which it is detected by this polishing end point detector that a desired amount of polishing has been completed. If rough polishing working is performed in this manner, then undulations with indentations and projections are corrected and flattened from a first surface shape WS (1) in which undulations with indentations and projections are present prior to polishing of the surface of the wafer W, and polishing to a desired amount of polishing is performed, so that a second surface shape WS (2) is obtained as shown in FIG. 4(A).

When the above-mentioned rough polishing working is completed, the index table 12 rotates 90 degrees in the clockwise direction, so that the wafer W moves into the intermediate polishing zone $S_3$ (step S6). Then, the polishing head 2b used for intermediate polishing that is supported on the rotating shaft 3 is lowered, so that the polishing pad 4b used for intermediate polishing is pressed against the surface that is being polished on the wafer W. In this case, the wafer chucking mechanism 20 and the polishing head 2b used for intermediate polishing are rotationally driven, so that intermediate polishing of the surface that is being polished on the wafer W is performed. The polishing pad 4b used for intermediate polishing has a relatively large diameter, so that the entire surface of the surface that is being polished on the wafer W is uniformly worked by the polishing pad 4b used for intermediate polishing (step S7). This intermediate polishing working is performed until a desired amount of polishing is obtained and it is detected by the end point detector that the intermediate polishing working has been completed (step S8). As a result, intermediate polishing working to a desired amount of polishing is performed from the second surface shape WS (2) that was obtained by the correction and flattening of surface undulations with indentations and projections by the rough polishing working, so that a third surface shape WS (3) is obtained.

Next, the index table 12 rotates 90 degrees in the clockwise direction, so that the wafer W moves into the finishing polishing zone $S_4$ (step S9). Then, in the same manner as described above, the polishing head 2c used for finishing polishing is lowered, and polishing working that uniformly finishes the entire surface of the surface that is being polished on the wafer W is performed by the polishing pad 4c used for finishing polishing until it is judged by the end point detector that polishing has been completed (steps S10 and S11). As a result, finishing polishing working to a specified amount of polishing is performed from the third surface shape WS (3) that was obtained by the intermediate polishing working, so that a fourth surface shape WS (4) is obtained.

Next, the index table 12 rotates 90 degrees in the clockwise direction, so that the wafer W on which finishing polishing has been completed returns to the loading and unloading zone $S_1$ (step S12). Then, this wafer W is conveyed onto the belt conveyor 16 by the wafer conveying robot 10 (step S13), cleaned by the wafer cleaning mechanism 17, and sent to subsequent processes.

As was described above, in the first method for working the surface that is being worked on the wafer W by means of the above-mentioned CMP apparatus 1, polishing that corrects undulating shapes with indentations and projections in the film thickness is performed while the surface that is being worked WS (1) is partially polished in the rough polishing working process by the polishing pad 4a used for rough polishing, which has a small diameter. Subsequently, working that uniformly polishes the entire surface of the surface that is being polished is performed by the polishing pad 4b used for intermediate polishing and the polishing pad 4c used for finishing polishing. As a result, as is shown in FIG. 4(A), a flat layer with a specified thickness is left on the surface of the wafer W following polishing working.

Furthermore, in cases where polishing working is performed using a polishing pad with a large diameter (similar to that of the polishing pads 4b and 4c used for intermediate polishing and finishing polishing) as the polishing pad used for rough polishing as well (as in conventional methods), a first surface shape WS (11) that has undulations with indentations and projections is polished with a uniform amount of polishing by the rough polishing working as shown in FIG. 4(B). As a result, a second surface shape WS (12) is obtained in which the original undulating shape with indentations and projections remain following rough polishing working. Furthermore, even if such a second surface shape WS (12) is further subjected to intermediate polishing and finishing polishing working, third and fourth surface shapes WS (13) and WS (14) in which the original undulating shape with indentations and projections similarly remains are obtained, so that the undulations with indentations and projections remain in the residual film on the surface even after polishing working, and it is difficult to flatten the surface.

Figure 5:
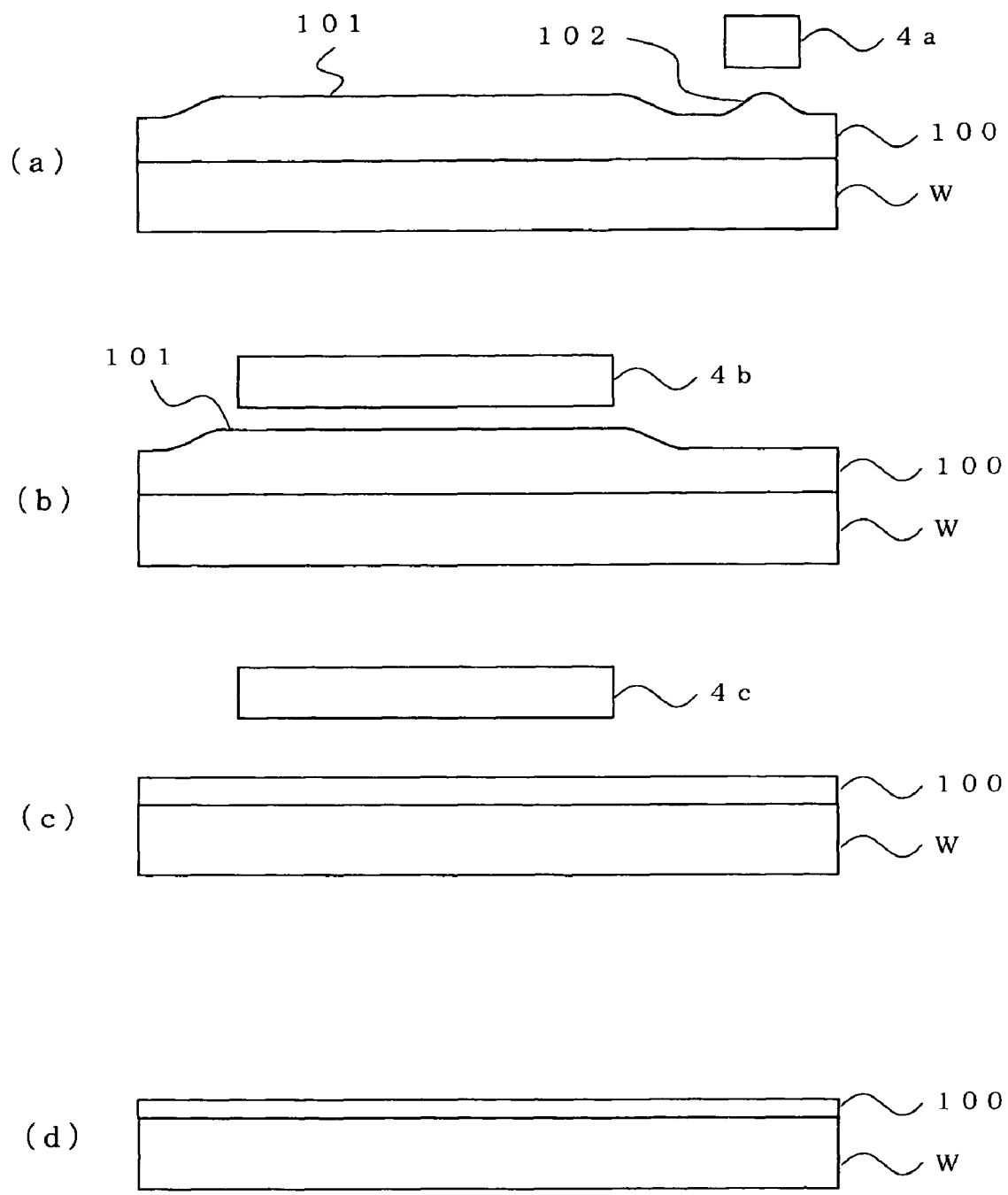
FIG. 5 is a diagram which shows a second working method in which the polishing working of the surface of a wafer (surface that is being worked) is performed using a CMP apparatus.

Next, a second working method in which polishing working of the surface of a wafer W (surface that is being worked) is performed using the CMP apparatus 1 will be described with reference to FIGS. 5 and 3. This second working method is a modification of the above-mentioned first working method; accordingly, a description of portions that are common to both the first and second working methods will be omitted. The second working method differs from the first working method with respect to the portions of the method constituting step S4 and step S7 in FIG. 3.

FIG. 5(a) is an explanatory diagram which shows in model form the surface shape of the wafer W prior to the rough polishing working process. A dielectric film 100 is formed on the surface (surface that is being worked) of the wafer W that constitutes the object of polishing. Furthermore, a projecting part 101 which has an area that is larger than the polishing surface of the polishing pad 4b used for intermediate polishing, and a projecting part 102 which has an area that is smaller than the polishing surface of the polishing pad 4b used for intermediate polishing, are present on the surface (surface that is being worked) of the wafer W prior to the rough polishing working process. In the second working method, not all of the undulations with indentations and projections are polished and flattened by the polishing pad 4a used for rough polishing in the rough polishing working process of step S4 in FIG. 3; instead, polishing is performed which flattens projecting parts other than the projecting part 101, such as the projecting part 102, so that the projecting part 101 which has an area that is larger than the polishing surface of the polishing pad 4b used for intermediate polishing is left, thus resulting in the state shown in FIG. 5(b). FIG. 5(b) is an explanatory diagram which shows in model form the surface shape of the wafer W following the rough polishing working process.

Figure 3:
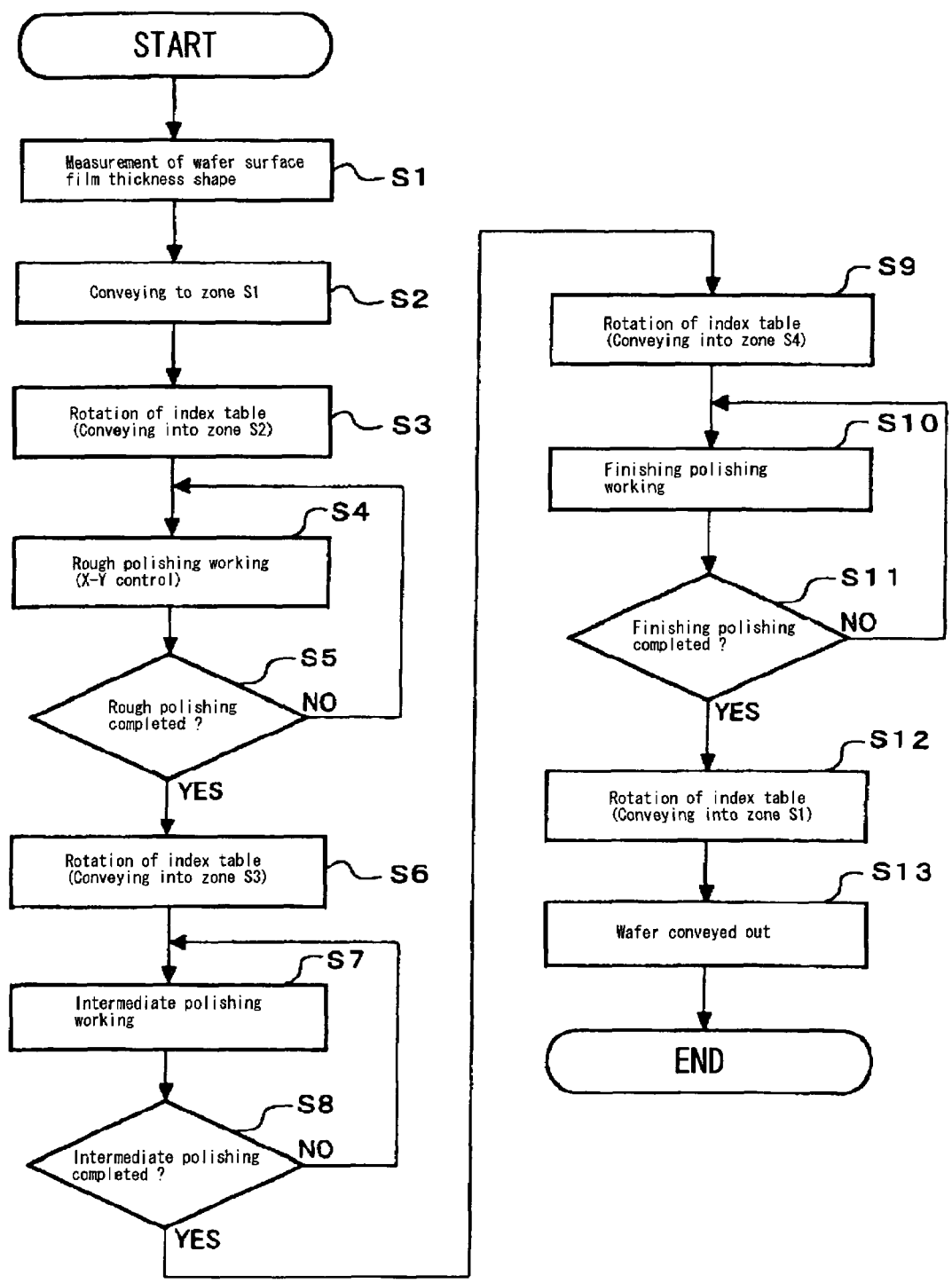
FIG. 3 is a flow chart which shows the polishing working process performed by the CMP apparatus shown in FIG. 1.

Furthermore, in the second working method, flattening of the projecting part 101 which has an area larger than the polishing surface of the polishing pad 4b used for intermediate polishing, and which was left in the preceding rough polishing working process (step S4), and uniform working of the entire surface of the surface that is being polished on the wafer W, are performed in the intermediate polishing working process of step S7 in FIG. 3, thus resulting in the state shown in FIG. 5(c). FIG. 5(c) is an explanatory diagram which shows in model form the surface shape of the wafer W following the intermediate polishing working process.

Then, a finishing polishing working process is performed in the same manner as in the first working method, thus resulting in the state shown in FIG. 5(d), so that a uniform flat layer (dielectric film) with a specified thickness is left on the wafer surface following the polishing treatment. FIG. 5(d) is an explanatory diagram which shows in model form the surface shape of the wafer W following the finishing polishing working process.

Thus, in the second working method, at least some of the projecting parts that can be flattened by the polishing pad 4b used for intermediate polishing are left in the rough polishing working process, and these remaining projecting parts are flattened in the intermediate polishing working process. Accordingly, the time required in order to flatten undulations with indentations and projections is shorter than in the first working method, in which all undulations with indentations and projections are flattened in the rough polishing working process by the polishing pad 4a used for rough polishing, which has a polishing surface that is smaller than the polishing surface of the polishing pad 4b used for intermediate polishing. Consequently, the following effect is obtained: namely, the total time required for polishing working can be shortened.

Furthermore, in the second working method, the above-mentioned effect can also be obtained in a case where not all of the projecting part 101 with an area that is larger than the polishing surface of the polishing pad 4b used for intermediate polishing is left in the rough polishing working process of step S4 in FIG. 3, but polishing working is instead performed so that at least a portion of this projecting part is left.

Figure 6:
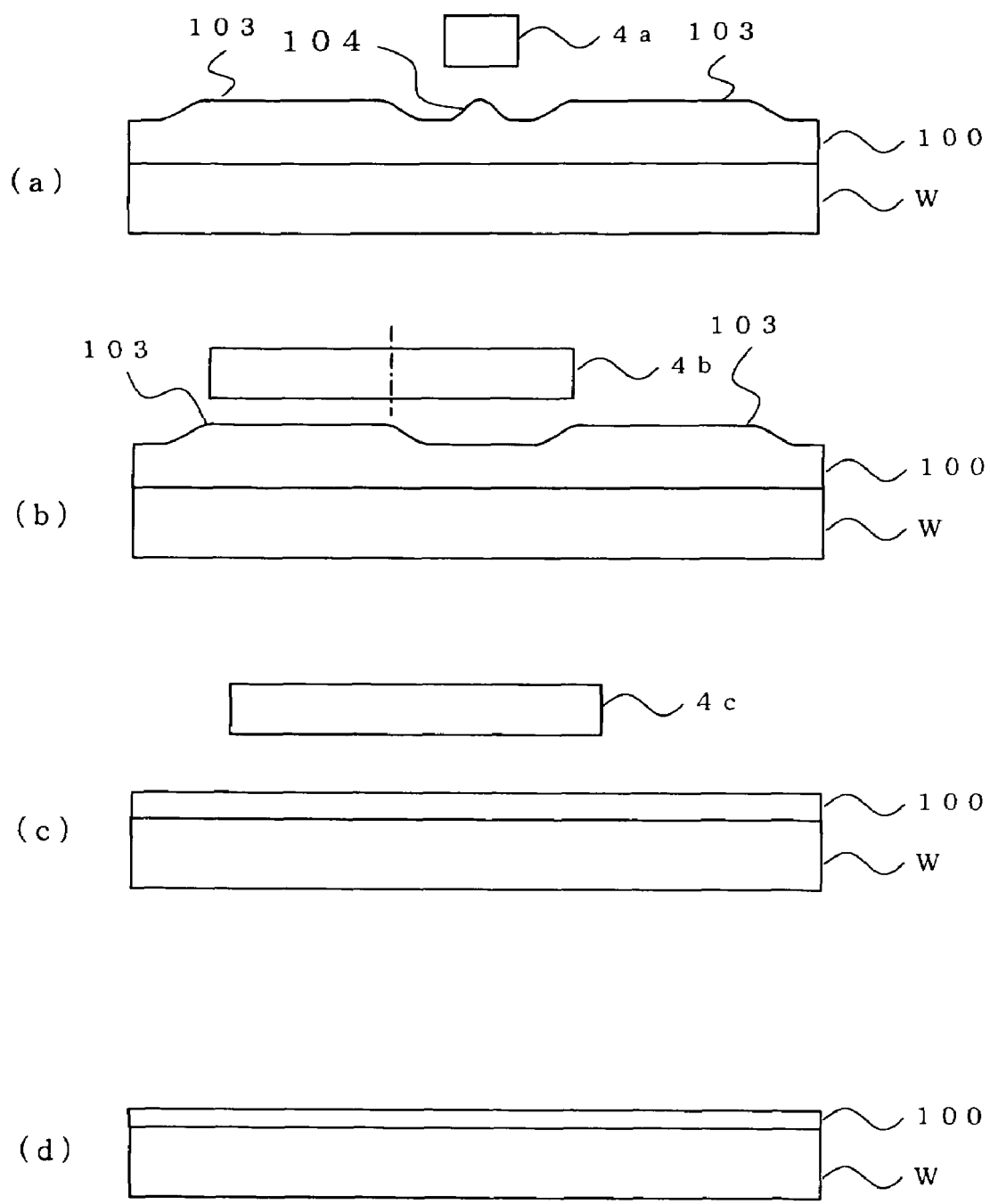
FIG. 6 is a diagram which shows a third working method in which the polishing working of the surface of a wafer (surface that is being worked) is performed using a CMP apparatus.
Figure 7:
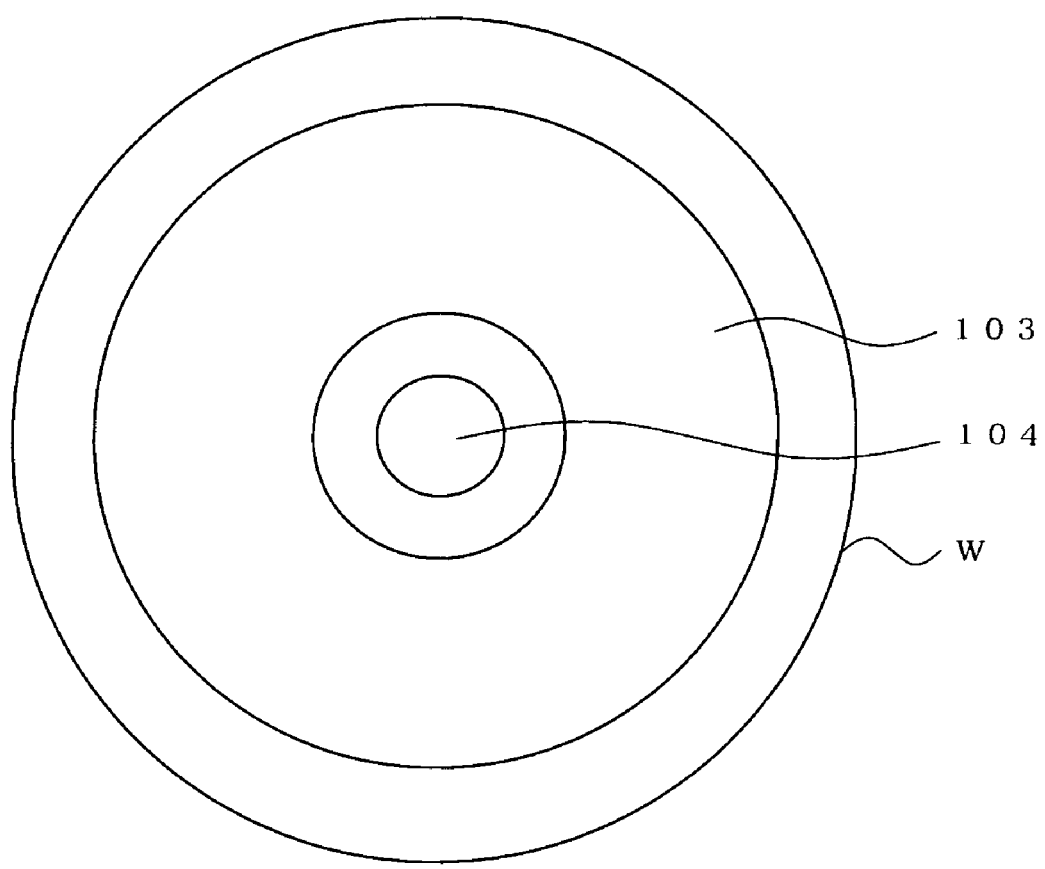
FIG. 7 is a diagram which shows a third working method in which the polishing working of the surface of a wafer (surface that is being worked) is performed using a CMP apparatus.

Next, a third working method for performing polishing working on the surface (surface that is being worked) of a wafer W using the CMP apparatus 1 will be described with reference to FIGS. 6, 7 and 3. This third working method is a modification of the above-mentioned first working method; accordingly, a description of portions that are common to both the first and third working methods will be omitted. The third working method differs from the first working method with respect to the portions of the method constituting step S4 and step S7 in FIG. 3.

FIG. 6(a) is an explanatory diagram which shows in model form the surface shape of the wafer W prior to the rough polishing working process. A dielectric film 100 is formed on the surface (surface that is being worked) of the wafer W that is the object of polishing. Furthermore, an annular projecting part 103 which is wider than the radius of the polishing surface of the polishing pad 4b used for intermediate polishing, and a projecting part 104 whose width is smaller than the radius of the polishing pad 4b used for intermediate polishing, are present on the surface (surface that is being worked) of the wafer W prior to the rough polishing working process. Furthermore, a plan view of FIG. 6(a) is shown in FIG. 7. In the third working method, not all of the undulations with indentations and projections are polished and flattened in the rough polishing working process of step S4 in FIG. 3; instead, projecting parts whose length in at least one direction of the surface that is being worked is less than the radius of the polishing surface of the polishing pad 4b are flattened. In FIG. 6(a), since the width of the annular projecting part 103 is greater than the radius of the polishing surface of the polishing pad 4b used for intermediate polishing, this projecting part is left without being flattened in the rough polishing process, and polishing is performed which flattens projecting parts other than the projecting part 103, such as the projecting part 104, resulting in the state shown in FIG. 6(b). FIG. 6(b) is an explanatory diagram which shows in model form the surface shape of the wafer W following the rough polishing working process.

Furthermore, in the third working method, flattening of the annular projecting part 103 that was left in the preceding rough polishing working process (step S4), and uniform working of the entire surface of the surface that is being polished on the wafer W, are performed in the intermediate polishing working process of step S7 in FIG. 3, resulting in the state shown in FIG. 6(c). FIG. 6(c) is an explanatory diagram which shows in model form the surface shape of the wafer W following the intermediate polishing working process.

Then, a finishing polishing working process is performed in the same manner as in the first working method, resulting in the state shown in FIG. 6(d), so that a uniform flat layer (dielectric film) with a specified thickness is left on the surface of the wafer following the polishing treatment. FIG. 6(d) is an explanatory diagram which shows in model form the surface shape of the wafer W following the finishing polishing working process.

Thus, in the third working method, at least some of the projecting parts that can be flattened by the polishing pad 4b used for intermediate polishing are left in the rough polishing working process, and these remaining projecting parts are flattened in the intermediate polishing working process. Accordingly, the time required in order to flatten undulations with indentations and projections is shorter than in the first working method, in which all undulations with indentations and projections are flattened in the rough polishing working process by the polishing pad 4a used for rough polishing, which has a polishing surface that is smaller than the polishing surface of the polishing pad 4b used for intermediate polishing. Consequently, the following effect is obtained: namely, the total time required for polishing working can be shortened.

Figure 8:
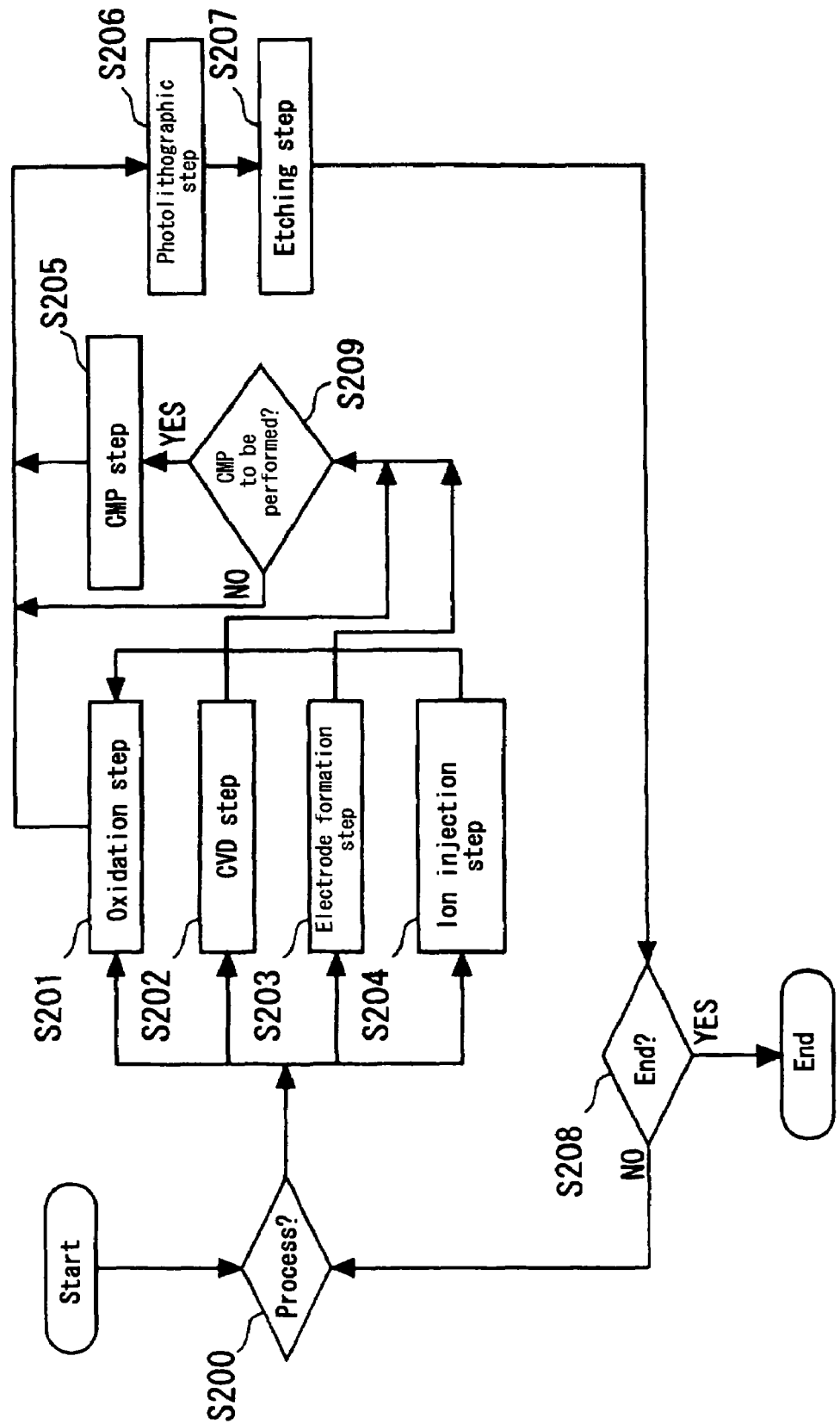
FIG. 8 is a flow chart which shows a semiconductor device manufacturing process constituting an embodiment of the present invention.

Next, an embodiment of the semiconductor device manufacturing method of the present invention will be described. FIG. 8 is a flow chart which shows a semiconductor device manufacturing process. When the semiconductor device manufacturing process is started, an appropriate treatment process is first selected in step S200 from the subsequently shown steps S201 through S204. The processing then proceeds to one of these steps S201 through S204.

Here, step S201 is an oxidation process in which the surface of the wafer is oxidized. Step S202 is a CVD process in which an insulating film or a dielectric film is formed on the surface of the wafer by CVD, etc. Step S203 is an electrode formation process in which electrodes are formed on the wafer by a process such as vapor deposition. Step S204 is an ion injection process in which ions are injected into the wafer.

Following the CVD process (S202) or electrode formation process (S203), the processing proceeds to step S205. Step S205 is a CMP process. In the CMP process, flattening of the inter-layer insulating film, or the formation of a damascene by the polishing of a metal film on the surface of the semiconductor device or the polishing of a dielectric film is performed using the working apparatus according to the present invention.

Following the CMP process (S205) or oxidation process (S201), the processing proceeds to step S206. Step S206 is a photolithographic process. In this process, the wafer is coated with a resist, a circuit pattern is burned onto the wafer by exposure using an exposure apparatus, and the exposed wafer is developed. Furthermore, the subsequent step S207 is an etching process in which the portions other than the developed resist image are removed by etching, after which the resist is stripped away, and the resist that has become unnecessary following the completion of etching is removed.

Next, in step S208, a judgement is made as to whether or not all of the necessary processes have been completed. In cases where these processes have not been completed, the processing returns to step S200, and the preceding steps are repeated so that a circuit pattern is formed on the wafer. If it is judged in step S208 that all of the processes have been completed, the processing is ended.

In the semiconductor device manufacturing method according to the present invention, since the working apparatus of the present invention is used in the CMP process, the yield of the CMP process is increased. Accordingly, the following effect is obtained: namely, semiconductor devices can be manufactured at a lower cost than in conventional semiconductor device manufacturing methods. Furthermore, the working apparatus of the present invention may also be used in the CMP processes of semiconductor device manufacturing processes other than the above-mentioned semiconductor device manufacturing process. Moreover, semiconductor devices that are manufactured using the semiconductor device manufacturing method of the present invention are manufactured with a high yield, so that the cost of semiconductor devices is reduced.

INDUSTRIAL APPLICABILITY

The working apparatus and working method of the present invention can be used for the flattening of surfaces that are worked on workpieces, and especially for the polishing of wafers in semiconductor manufacturing processes. Furthermore, the semiconductor manufacturing method of the present invention can be used to manufacture semiconductors.

The invention claimed is:

1. A working apparatus which comprises a carrying and holding mechanism that carries and holds the workpiece, a working tool that performs working on the surface that is to be worked on the workpiece, and a tool holding mechanism that holds the working tool, and which is constructed so that working is performed on the surface that is to be worked by causing relative motion between the working tool and the workpiece while causing the working tool to contact the surface that is to be worked on the workpiece, this working apparatus being characterized by the fact that the working tool has a first working tool that can partially work the surface that is to be worked, and a second working tool that can uniformly work the entire surface of the surface that is to be worked; and the working surface of the first working tool is smaller than the surface that is being worked; and wherein the carrying and holding mechanism is configured to carry and hold the workpiece in which the size of the surface that is being worked is larger than the size of the working surface of the first working tool.

2. The working apparatus according to claim 1, which is characterized by the fact that the working surface of the first working tool is smaller than the working surface of the second working tool.

3. A semiconductor device manufacturing method which is characterized by the fact that this method comprises a process in which a polishing pad that performs surface polishing on a workpiece is used as the working tool in the working apparatus according to claim 2, and surface polishing is performed on a semiconductor wafer that constitutes the workpiece.

4. The working apparatus according to claim 2, which is characterized by the fact that the workpiece is a semiconductor wafer, the first working tool and the second working tool are polishing pads, the diameter of the second polishing pad is larger than the radius of the semiconductor wafer, and the diameter of the second polishing pad is smaller than the diameter of the semiconductor wafer.

5. The working apparatus according to claim 4, which is characterized by the fact that this apparatus comprises a surface shape measuring device that measures undulations with indentations and projections in the surface that is being worked.

6. A working method which is characterized by the fact that this method uses the working apparatus according to claim 4, and this method comprises:
- a step in which working that flattens undulations with indentations and projections in the surface that is being worked is performed by the first polishing pad while leaving at least portions of projecting parts on the surface being worked that have an area that is larger than the polishing surface of the second polishing pad; and
- a step in which working that flattens undulations with indentations and projections in the surface that is being worked and working that uniformly polishes the entire surface of the surface that is being polished are performed by the second polishing pad.

7. The working method according to claim 6, which is characterized by the fact that a thin film is formed on the surface that is being worked, and a flat thin film with a specified thickness remains on the surface that is being worked following the completion of working.

8. The working method according to claim 7, which is characterized by the fact that the thin film is a dielectric film.

9. A working method which is characterized by the fact that this method uses the working apparatus according to claim 4, and this method comprises:
- a step in which working that flattens projecting parts whose length in at least one direction of the surface that is being worked is smaller than the radius of the polishing surface of the second polishing pad is performed by the first polishing pad; and
- a step in which working that flattens undulations with indentations and projections in the surface that is being worked and working that uniformly polishes the entire surface of the surface that is being polished are performed by the second polishing pad.

10. The working method according to claim 9, which is characterized by the fact that a thin film is formed on the surface that is being worked, and a flat thin film with a specified thickness remains on the surface that is being worked following the completion of working.

11. The working method according to claim 10, which is characterized by the fact that the thin film is a dielectric film.

12. The working apparatus according to claim 1, which is characterized by the fact that the working surface of the second working tool is larger than the surface that is being worked.

13. A semiconductor device manufacturing method which is characterized by the fact that this method comprises a process in which a polishing pad that performs surface polishing on a workpiece is used as the working tool in the working apparatus according to claim 12, and surface polishing is performed on a semiconductor wafer that constitutes the workpiece.

14. The working apparatus according to claim 1, which is characterized by the fact that the apparatus comprises a surface shape measuring device that measures undulations with indentations and projections on the surface that is being worked.

15. A working method which is characterized by the fact that the working apparatus according to claim 14 is used, the surface shape of the surface that is being worked is measured by means of the surface shape measuring device prior to working by means of the working tool, and working that flattens undulations with indentations and projections in the surface that is being worked is performed by means of the first working tool on the basis of these measurement results.

16. A semiconductor device manufacturing method which is characterized by the fact that this method comprises a process in which a polishing pad that performs surface polishing on a workpiece is used as the working tool in the working method according to claim 15, and surface polishing is performed on a semiconductor wafer that constitutes the workpiece.

17. The working method according to claim 15, which is characterized by the fact that a thin film is formed on the surface that is being worked, and a flat thin film with a specified thickness remains on the surface that is being worked following the completion of working.

18. The working method according to claim 17, which is characterized by the fact that the thin film is a dielectric film.

19. A semiconductor device manufacturing method which is characterized by the fact that this method comprises a process in which a polishing pad that performs surface polishing on a workpiece is used as the working tool in the working apparatus according to claim 14, and surface polishing is performed on a semiconductor wafer that constitutes the workpiece.

20. A semiconductor device manufacturing method which is characterized by the fact that this method comprises a process in which a polishing pad that performs surface polishing on a workpiece is used as the working tool in the working apparatus according to claim 1, and surface polishing is performed on a semiconductor wafer that constitutes the workpiece.

* * * * *